US011315930B2

(12) United States Patent
Huang et al.

(10) Patent No.: US 11,315,930 B2
(45) Date of Patent: Apr. 26, 2022

(54) SEMICONDUCTOR STRUCTURE AND METHOD OF MANUFACTURING THE SAME

(71) Applicant: NANYA TECHNOLOGY CORPORATION, New Taipei (TW)

(72) Inventors: Ching-Chia Huang, Taipei (TW); Wei-Ming Liao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 251 days.

(21) Appl. No.: 16/792,157

(22) Filed: Feb. 14, 2020

(65) Prior Publication Data

US 2021/0257372 A1    Aug. 19, 2021

(51) Int. Cl.
*H01L 27/108* (2006.01)
*H01L 23/528* (2006.01)
*H01L 29/49* (2006.01)
*H01L 29/08* (2006.01)
*H01L 23/532* (2006.01)
*H01L 21/306* (2006.01)

(52) U.S. Cl.
CPC .. *H01L 27/10823* (2013.01); *H01L 21/30604* (2013.01); *H01L 23/528* (2013.01); *H01L 23/53257* (2013.01); *H01L 23/53271* (2013.01); *H01L 27/10808* (2013.01); *H01L 27/10852* (2013.01); *H01L 27/10876* (2013.01); *H01L 27/10888* (2013.01); *H01L 27/10891* (2013.01); *H01L 29/0847* (2013.01); *H01L 29/4925* (2013.01); *H01L 29/4958* (2013.01)

(58) Field of Classification Search
CPC ......... H01L 27/10823; H01L 27/10876; H01L 29/7813; H01L 29/7825; H01L 29/42336; H01L 29/42352; H01L 29/4925–4941; H01L 29/4958
See application file for complete search history.

(56) References Cited

U.S. PATENT DOCUMENTS

2015/0349073 A1    12/2015    Kang
2019/0296017 A1     9/2019    Cho et al.

OTHER PUBLICATIONS

Young Kwon Kim et al., "Partial Isolation Type Saddle-FinFET(Pi-FinFET) for Sub-30 nm DRAM Cell Transistors" Electronics 2019, 8, 8; doi:10.3390/electronics8010008, MDPI Journal(https://www.mdpi.com/2079-9292/8/1/8) Dec. 21, 2018.

*Primary Examiner* — Amar Movva
(74) *Attorney, Agent, or Firm* — CKC Partners Co., LLC

(57) ABSTRACT

A semiconductor structure includes a substrate, a first word line structure, a second word line structure, a third word line structure, and a fourth word line structure. The substrate has an active region surrounded by an isolation structure. The first and second word line structures are disposed in the active region and separated from each other. The third and fourth word line structures are disposed in the isolation structure, and each of the third and the fourth word line structures includes a bottom work-function layer, a middle work-function layer on the bottom work-function layer, and a top work function layer on the work-function middle layer. The middle work-function layer has a work-function that is higher than a work-function of the top work-function layer and a work-function of the bottom work-function layer.

11 Claims, 9 Drawing Sheets

SEMICONDUCTOR STRUCTURE AND METHOD OF MANUFACTURING THE SAME

BACKGROUND

Field of Invention

The present disclosure relates to a semiconductor structure and a method of manufacturing the semiconductor structure.

Description of Related Art

With the rapid growth of electronic industry, the development of semiconductor device has achieved high performance and miniaturization. As the size of semiconductor devices, such as dynamic random access memory (DRAM) devices, shrinks, the gate channel length decreases correspondingly. Consequently, a short channel effect may occur. To deal with such problem, a buried-channel array transistor (BCAT) device has been proposed.

However, although the recessed channel of the BCAT device has improved the short channel effect, the BCAT device suffers from low driving current and threshold voltage (Vth) sensitivity, and thus adversely affects the performance and the stability of the semiconductor device.

SUMMARY

In accordance with an aspect of the present disclosure, a semiconductor structure is provided. The semiconductor structure includes a substrate, a first word line structure, a second word line structure, a third word line structure, and a fourth word line structure. The substrate has an active region surrounded by an isolation structure. The first word line structure and the second word line structure are disposed in the active region and separated from each other. The third word line structure and the fourth word line structure are disposed in the isolation structure, and each of the third word line structure and the fourth word line structure includes a bottom work-function layer; a middle work-function layer on the bottom work-function layer; and a top work-function layer on the work-function middle layer, wherein the middle work-function layer has a work-function that is higher than a work-function of the top work-function layer and a work-function of the bottom work-function layer.

According to some embodiments of the present disclosure, the semiconductor structure further includes first source/drain regions and a second source/drain region, wherein the second source/drain region is disposed between the first and the second word line structures, and the first and the second source/drain regions are disposed on opposite sides of each of the first word line structure and the second word line structure.

According to some embodiments of the present disclosure, the semiconductor structure further includes capacitors electrically connected to the first source/drain regions, and a bit line contact electrically connected to the second source/drain region.

According to some embodiments of the present disclosure, each of the first word line structure and the second word line structure includes a lower portion and an upper portion, wherein the lower portion has a work-function that is higher than a work-function of the upper portion.

According to some embodiments of the present disclosure, each of the first word line structure and the second word line structure includes a lower portion and an upper portion, wherein the lower portion has a work-function that is higher than a work-function of the upper portion.

According to some embodiments of the present disclosure, the semiconductor structure further includes a dielectric layer between the first word line structure and an inner surface of the active region, and between the second word line structure and another inner surface of the active region.

According to some embodiments of the present disclosure, a bottom of the third word line structure and the fourth word line structure is disposed below a bottom of the first word line structure and the second word line structure.

According to some embodiments of the present disclosure, a bottom surface of the middle work-function layer and a bottom surface of each of the first and the second word line structures are at same horizontal level.

According to some embodiments of the present disclosure, a top surface of the top work-function layer and a top surface of each of the first and the second word line structures are at same horizontal level.

According to some embodiments of the present disclosure, the semiconductor structure further includes a capping layer disposed on the first, the second, the third, and the fourth word line structures.

According to some embodiments of the present disclosure, the capping layer has a top surface that is level with a top surface of the isolation structure.

In accordance with an aspect of the present disclosure, a method of manufacturing a semiconductor structure is provided. The method includes following operations. A substrate having an active region surrounded by an isolation layer is provided. A first trench and a second trench are formed in the active region, and a third trench and a fourth trench are formed in the isolation layer. A bottom work-function layer is formed in the third trench and the fourth trench, respectively. A middle work-function layer is formed on the bottom work-function layer and in the first and the second trenches. A top work-function layer is formed on the middle work-function layer. A capping layer is formed on the top work-function layer that fills a remaining region of the first, the second, the third and the fourth trenches.

According to some embodiments of the present disclosure, the substrate includes a first type semiconductor layer and a second type semiconductor layer on the first type semiconductor layer.

According to some embodiments of the present disclosure, each of the third and the fourth trenches has a depth that is greater than a depth of each of the first and the second trenches.

According to some embodiments of the present disclosure, the method further includes forming a dielectric layer on inner surfaces of the first and the second trenches before forming the bottom work-function layer.

According to some embodiments of the present disclosure, the middle work-function layer has a work-function that is higher than a work-function of the first and the top work-function layers.

According to some embodiments of the present disclosure, a top surface of the bottom work-function layer in the third and the fourth trench and a bottom of the middle work-function layer in the first and the second trench are at same horizontal level.

According to some embodiments of the present disclosure, the method further includes forming a doped region in the active region between the first and the second trenches.

According to some embodiments of the present disclosure, the method further includes forming a bit line contact electrically connected to the doped region.

According to some embodiments of the present disclosure, the method further includes forming capacitors on a top surface of the active region between the isolation layer and the first and the second trenches respectively.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Although below using a series of actions or steps described in this method disclosed, but the order of these actions or steps shown should not be construed to limit the present invention. For example, certain actions or steps may be performed in different orders and/or concurrently with other steps. Moreover, not all steps must be performed in order to achieve the depicted embodiment of the present invention. Furthermore, each operation or procedure described herein may contain several sub-steps or actions.

Figure 1:
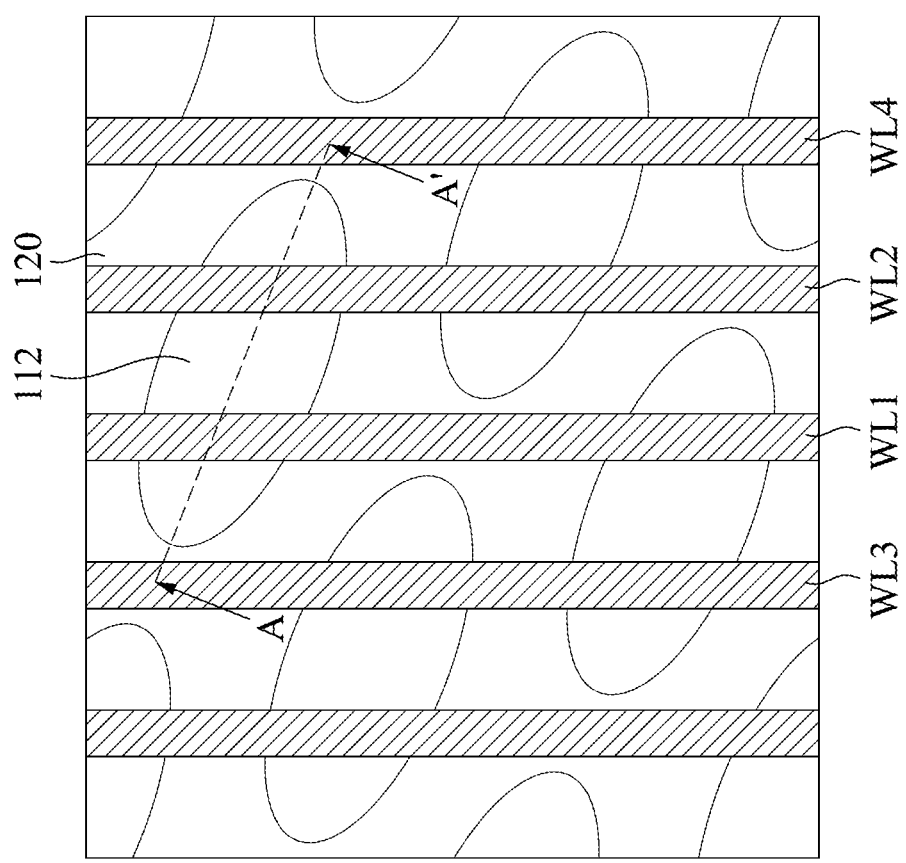
FIG. 1 is a top view of a semiconductor structure in accordance with some embodiments of the present disclosure.
Figure 2:
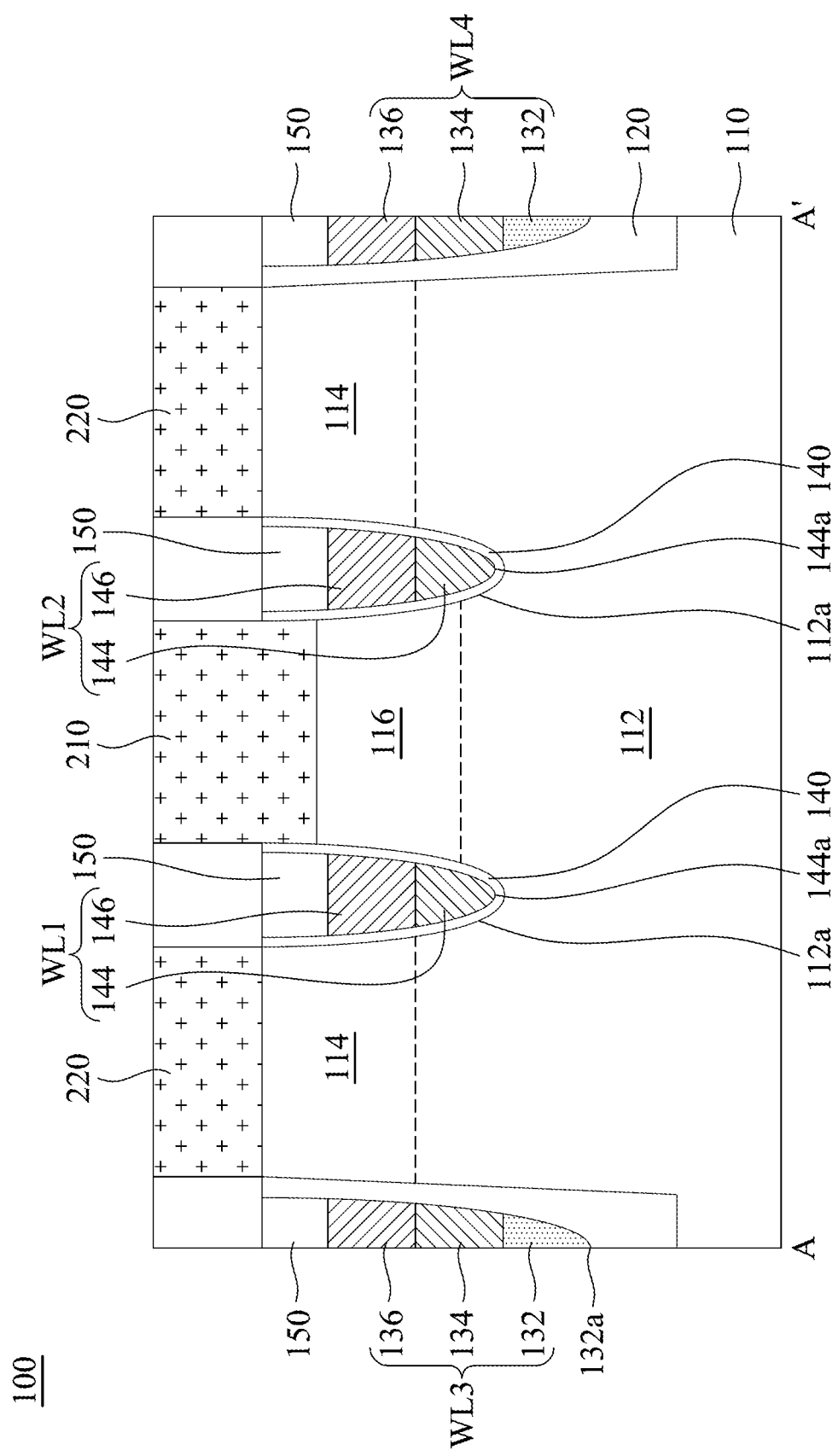
FIG. 2 is a cross-sectional view of the semiconductor structure taken along line A-A' of FIG. 1.

FIG. 1 is a top view of a semiconductor structure 100 in accordance with some embodiments of the present disclosure. FIG. 2 is a cross-sectional view of the semiconductor structure 100 taken along line A-A' of FIG. 1. In some embodiments, the semiconductor structure 100 may be an array transistor, such as a buried-channel array transistor (BCAT). Referring to FIG. 1 and FIG. 2, the semiconductor structure 100 includes a substrate 110, a first word line structure WL1, a second word line structure WL2, a third word line structure WL3, and a fourth word line structure WL4.

As shown in FIG. 1 and FIG. 2, the substrate 110 has an active region 112 surrounded by an isolation structure 120. Specifically, the isolation structure 120 is in contact with the active region 112 and defines the active region 112 in the substrate 110.

The first word line structure WL1 and the second word line structure WL2 are disposed in the active region 112 and are separated from each other. That is, a portion of the active region 112 is between the first word line structure WL1 and the second word line structure WL2. In some embodiments, each of the first word line structure WL1 and the second word line structure WL2 includes a lower portion 144 and an upper portion 146, and the lower portion 144 has a work-function that is higher than a work-function of the upper portion 146. In some embodiments, the semiconductor structure 100 further includes a dielectric layer 140 between the first word line structure WL1 and an inner surface 112a of the active region 112, and between the second word line structure WL2 and another inner surface 112a of the active region 112.

The third word line structure WL3 and the fourth word line structure WL4 are disposed in the isolation structure 120. As shown in FIG. 2, each of the third word line structure WL3 and the fourth word line structure WL4 includes a bottom work-function layer 132, a middle work-function layer 134 on the bottom work-function layer 132, and a top work-function layer 136 on the middle work-function layer 134. The middle work-function layer 134 has a work-function that is higher than a work-function of the top work-function layer 136 and a work-function of the bottom work-function layer 132. In some embodiments, the work-function of the bottom work-function layer 132 is different from the work-function of the top work-function layer 136. In other embodiments, the work-function of the bottom work-function layer 132 is same as the work-function of the top work-function layer 136. The third word line structure WL3 and the fourth word line structure WL4 may serve as passing word lines (PWL). In some embodiments, the lower portion 144 of the first and the second word line structures WL1 and WL2 are same as the middle work-function layer 134 of the third and the fourth word line structures WL3 and WL4, and the upper portion 146 of the first and the second word line structures WL1 and WL2 are same as the top work-function layer 136 of the third and the fourth word line structures WL3 and WL4.

In some embodiments, third word line structure WL3 and the fourth word line structure WL4 respectively have a bottom 132a disposed below a bottom 144a of the first word line structure WL1 and the second word line structure WL2. In some embodiments, a bottom surface of the middle work-function layer 134 (i.e., an interface of the bottom work-function layer 132 and the middle work-function layer 134) and the bottom 144a of each of the first and the second word line structures WL1 and WL2 are at same horizontal level. Similarly, an interface of the middle work-function layer 134 and the top work-function layer 136 may be level with an interface of the lower portion 144 and the upper portion 146. In some embodiments, a top surface of each of the third and the fourth word line structures WL3 and WL4 and a top surface of each of the first and the second word line structures WL1 and WL2 are at same horizontal level. That is, a top surface of the top work-function layer 136 is level with a top surface of the upper portion 146.

In some embodiments, the semiconductor structure 100 further includes a capping layer 150 disposed on the first, the second, the third, and the fourth word line structures WL1, WL2, WL3, and WL4. For clarify, the capping layer 150 above the first, the second, the third, and the fourth word line structures WL1, WL2, WL3, and WL4 are not shown in FIG. 1. The capping layer 150 covers the upper portion 146 of the first and second word line structures WL1 and WL2, and the top work-function layer 136 of the third and the fourth word line structures WL3 and WL4. In some embodiments, the capping layer 150 has a top surface that is level with a top surface of the isolation structure 120.

In some embodiments, the semiconductor structure 100 may be an array transistor, such as a buried-channel array transistor (BCAT). As shown in FIG. 2, the transistors may include first source/drain regions 114 and a second source/drain region 116. In some examples, the second source/drain region 116 between the first and the second word line structures WL1 and WL2 may be source region of the transistors, and the first and the second source/drain regions 114 and 116 disposed on opposite sides of each of the first word line structure WL1 and the second word line structure WL2 may be drain regions of the transistors. In some embodiments, the semiconductor structure 100 further includes capacitors 220 electrically connected to the first source/drain regions 114, and a bit line contact 210 electrically connected to the second source/drain region 116.

Figure 3:
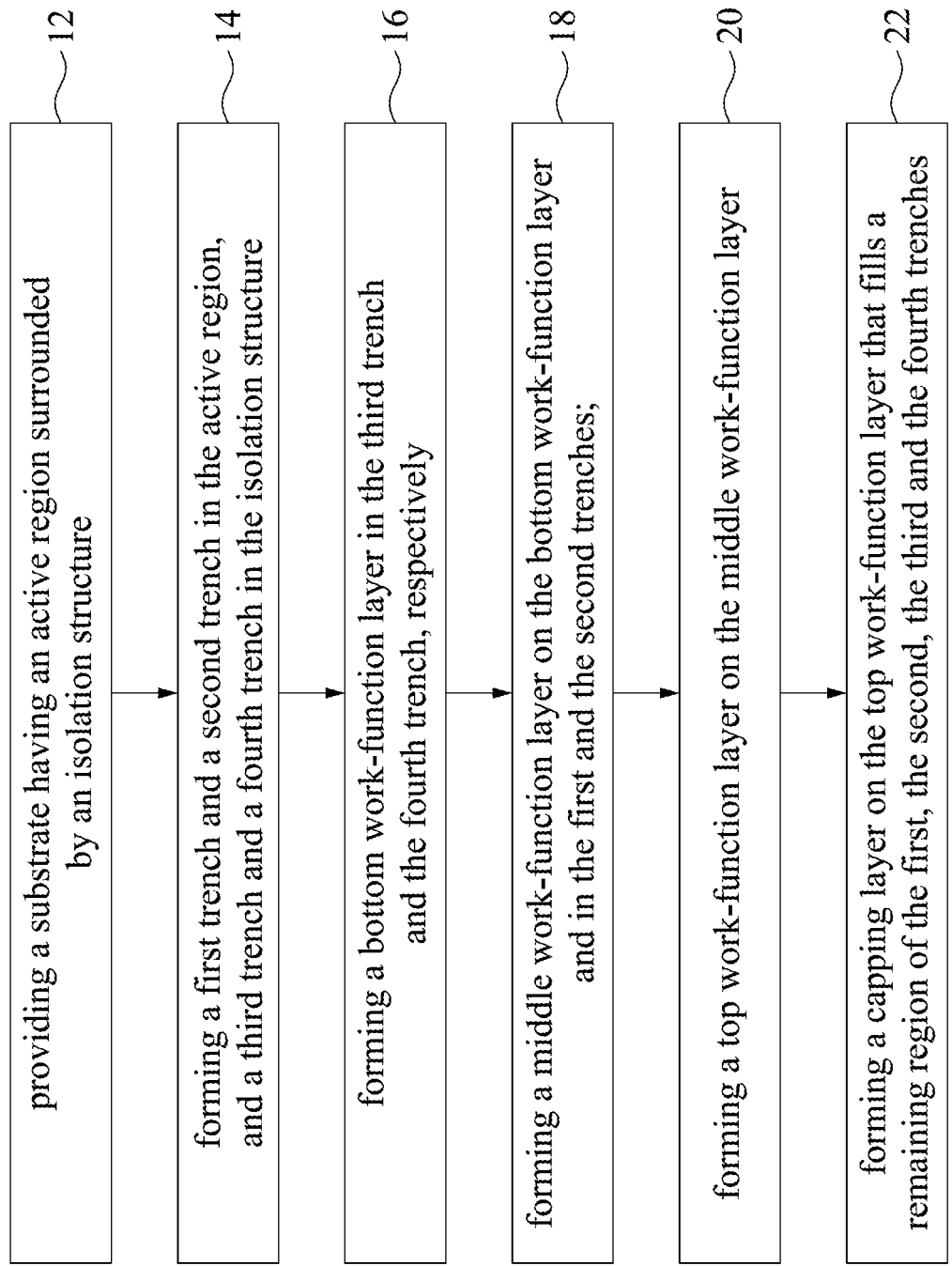
FIG. 3 is a flow chart illustrating a method of manufacturing a semiconductor structure in accordance with some embodiments of the present disclosure.

FIG. 3 is a flow chart illustrating a method 10 of manufacturing a semiconductor structure 100 in accordance with some embodiments of the present disclosure. As shown in FIG. 3, the method 10 includes operation 12, operation 14, operation 16, operation 18, operation 20, and operation 22. FIG. 4 to FIG. 9 are cross-sectional views of various intermediary stages in the manufacturing of semiconductor structure 100 in accordance with some embodiments of the present disclosure.

Please refer to FIG. 3, in the operation 12 of the method 10, a substrate having an active region surrounded by an isolation layer is provided. FIGS. 4-7 illustrate the detail steps of implementing operation 12 in accordance with an embodiment of the present disclosure.

Figure 4:
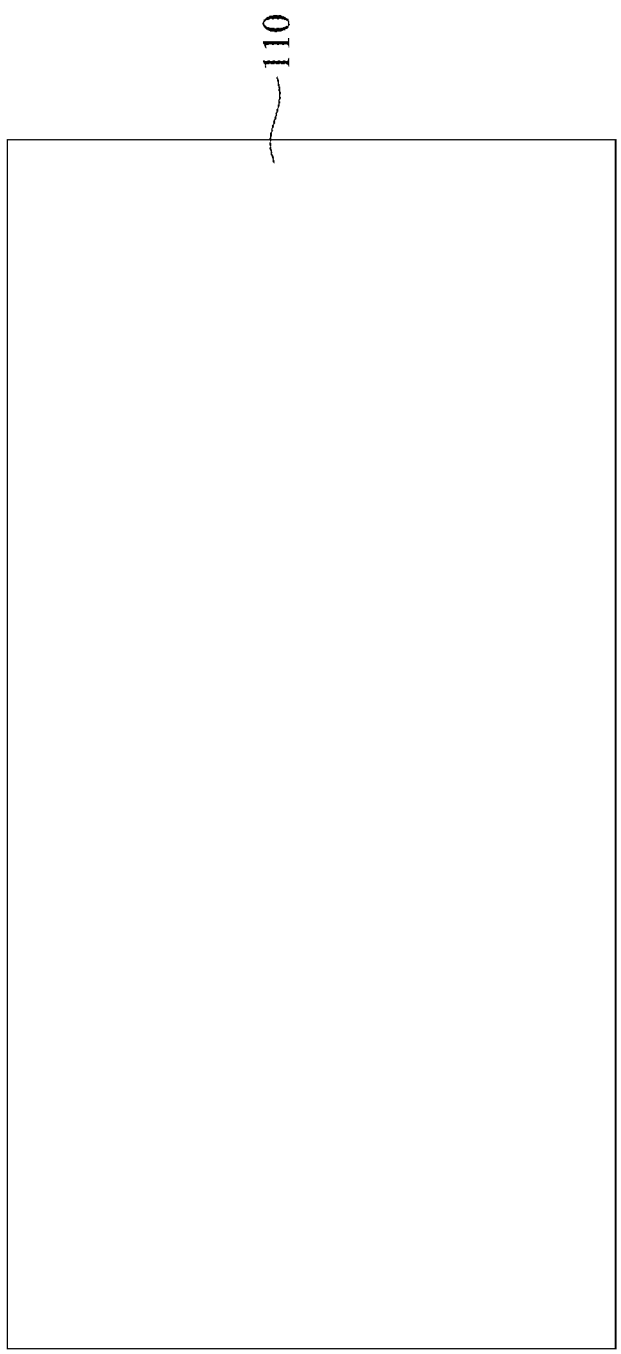
FIG. 4 to FIG. 9 are cross-sectional views of various intermediary stages in the manufacturing of semiconductor structure in accordance with some embodiments of the present disclosure.
Figure 5:
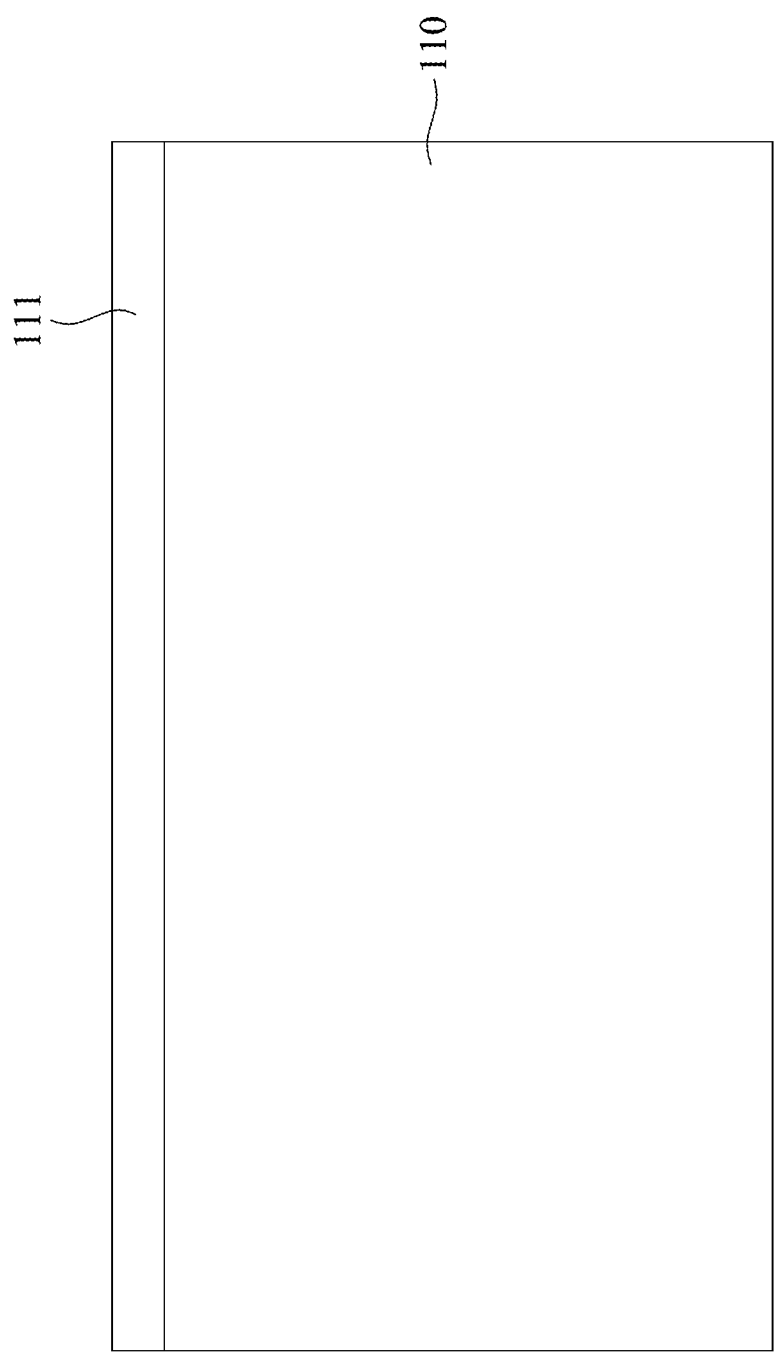

Referring to FIG. 4 and FIG. 5, an oxide layer 111 may be formed on a substrate 110. In some embodiments, the substrate 110 is silicon substrate. Alternatively, the substrate 110 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 6:
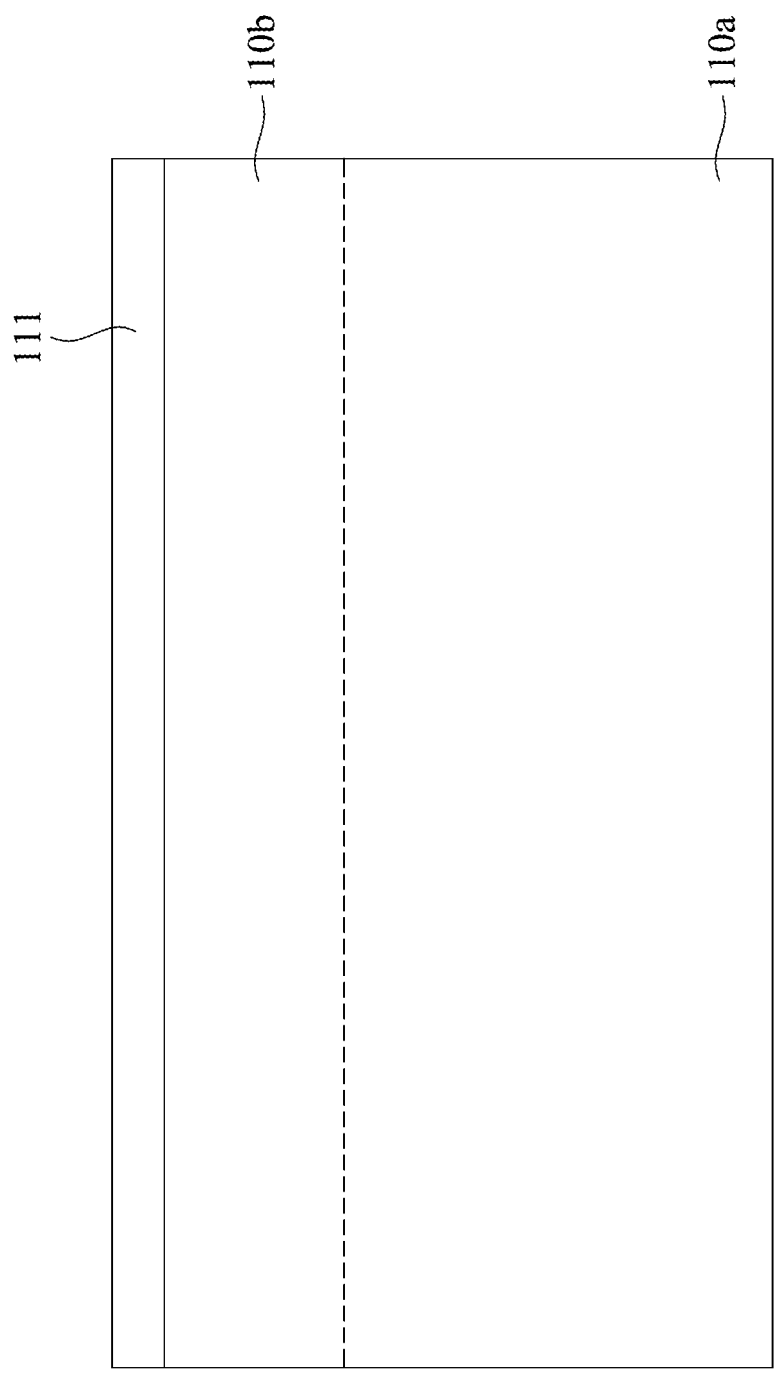

Next, referring to FIG. 6, the substrate 110 may be doped to form a first type semiconductor layer 110a and a second type semiconductor layer 110b on the first type semiconductor layer 110a by ion implantation process. For example, the first type semiconductor layer 110a may be doped with p-type dopants, such as boron (B), indium (In), or other P-type materials, and the second type semiconductor layer 110b may be doped with n-type dopants, such as arsenic (As), antimony (Sb), phosphorous (P), or other N-type materials.

Figure 7:
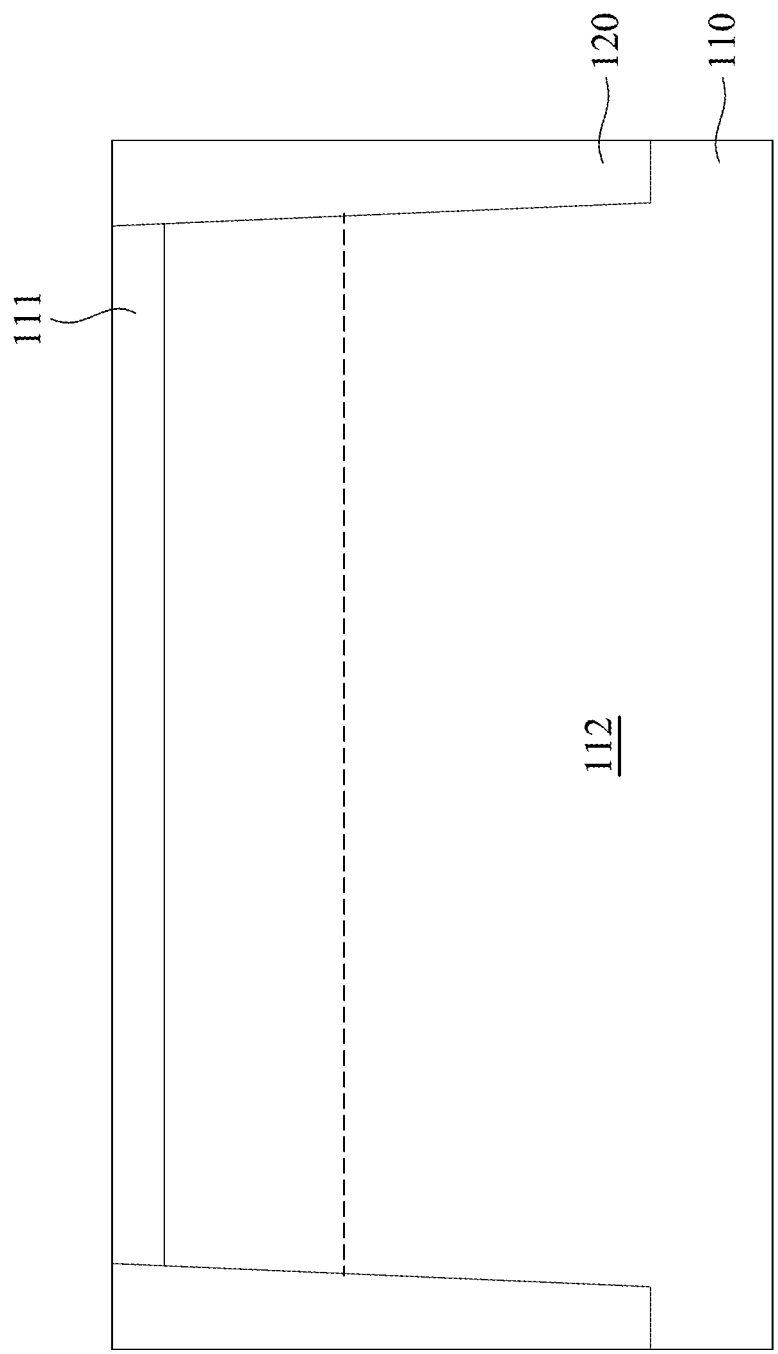

Referring to FIG. 7, the isolation structure 120 is then formed in the substrate 110 and surrounds the substrate 110. In greater details, the substrate 110 is patterned before forming the isolation structure 120. For example, the substrate 110 may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process.

In some embodiments, the isolation structure 120 may include silicon oxide, silicon nitride or a silicon oxynitride, or other suitable materials. The isolation structure 120 may be a shallow trench isolation (STI) structure. The isolation structure 120 may be formed by physical vapor deposition (PVD), chemical vapor deposition (CVD), or the like. As shown in FIG. 7, the substrate 110 having the active region 112 surrounded by the isolation structure 120 is formed.

Figure 8:
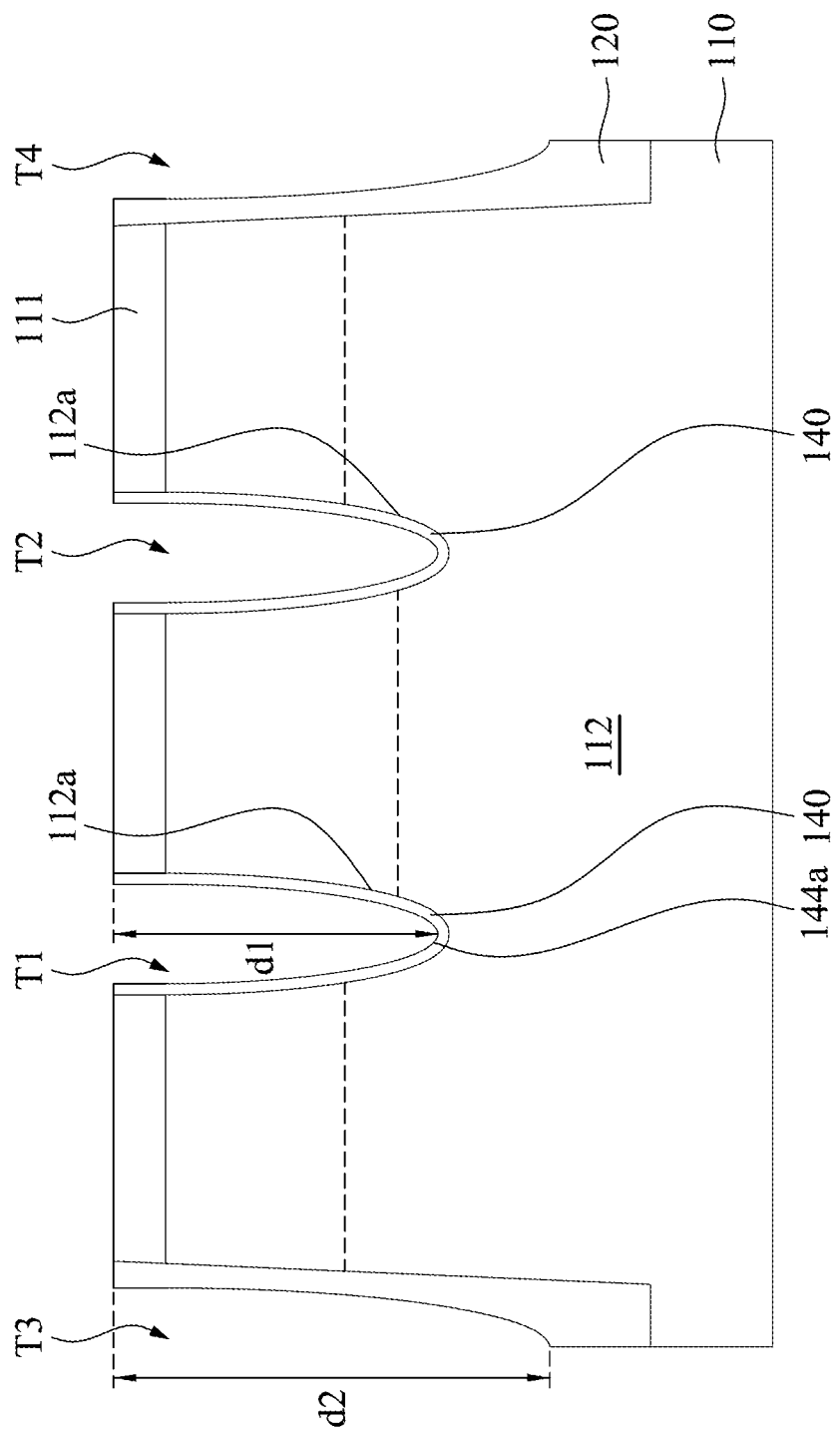

Please refer to FIG. 3 and FIG. 8, in the operation 14 of the method 10, a first trench T1 and a second trench T2 are formed in the active region 112, and a third trench T3 and a fourth trench T4 are formed in the isolation structure 120. As shown in FIG. 8, each of the third and the fourth trenches T3 and T4 has a depth d2 that is greater than a depth d1 of each of the first and the second trenches T1 and T2. The first, second, third and fourth trenches T1, T2, T3, and T4 may be formed by performing an etching process on the substrate 110 and the isolation structure 120 respectively. The etching process may include a selective wet etching process or a selective dry etching process. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. In some other embodiments, a wet etching solution may include $NH_4OH$, KOH (potassium hydroxide), HF (hydrofluoric acid), TMAH (tetramethylammonium hydroxide), other suitable wet etching solutions, or combinations thereof. In yet some other embodiments, a dry etching process may include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

In some embodiments, a dielectric layer 140 is further formed on inner surfaces 112a of the first and the second trenches T1 and T2. The dielectric layer 140 may be formed by CVD, atomic layer deposition (ALD) or any suitable method. For example, the dielectric layer 140 is formed by using a highly conformal deposition process such as atomic layer deposition in order to ensure the formation of dielectric layer 140 having a uniform thickness. Specifically, the dielectric layer 140 may be conformally formed to cover the active region 112 exposed by the first and the second trenches T1 and T2. In some embodiments, the dielectric layer 140 may be further formed on inner surfaces of the isolation structure 120. In some embodiments, the dielectric layer 140 includes one or more layers of a dielectric material, such as silicon oxide, titanium nitride, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

Figure 9:
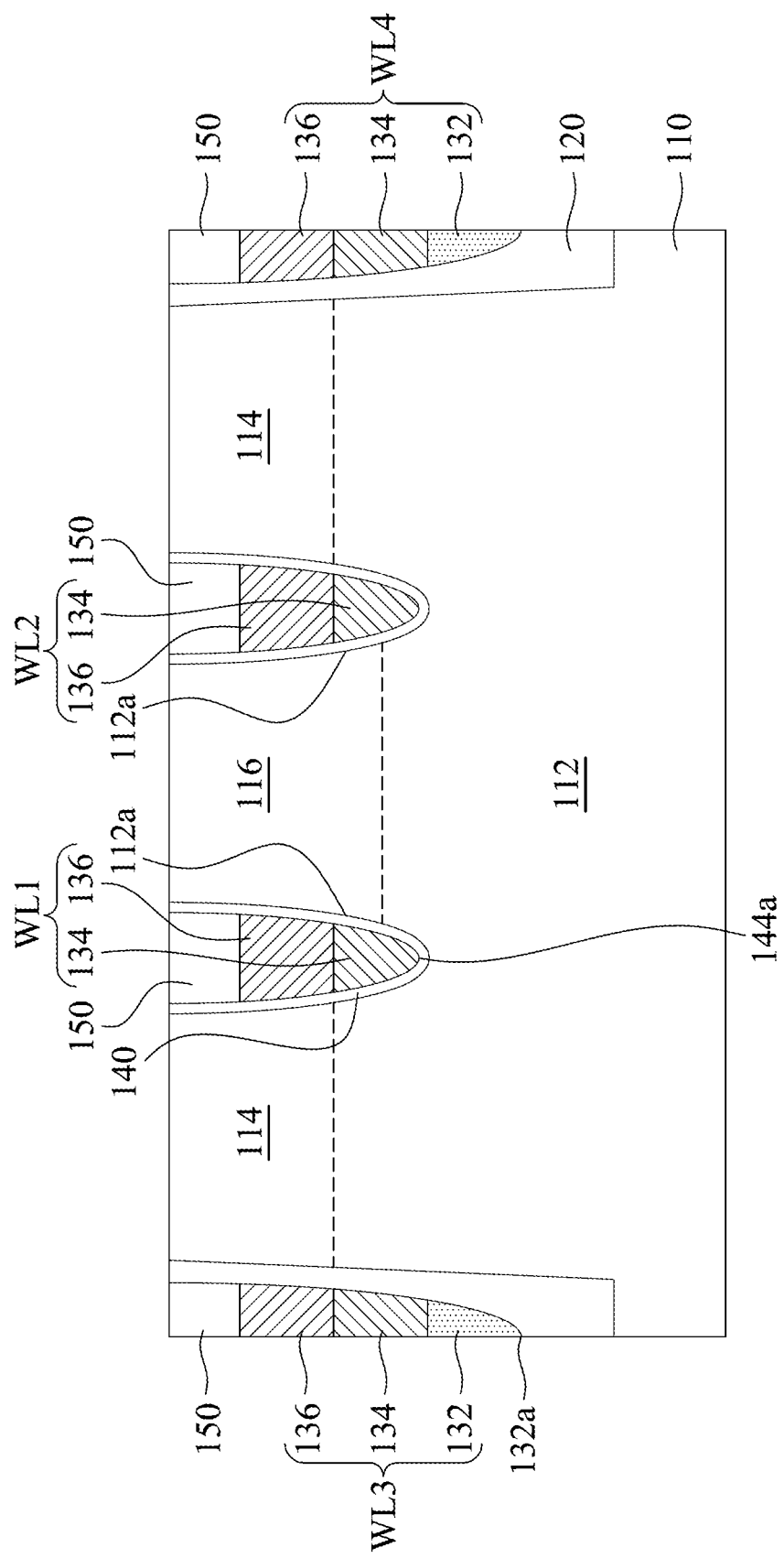

Referring to FIG. 3 and FIG. 9, in the operation 16 of the method 10, a bottom work-function layer 132 is formed in the third trench T3 and the fourth trench T4, respectively. In some embodiments, the bottom work-function layer 132 may include low work-function material, such as polysilicon, which has a work-function value of about 4.2 eV. The bottom work-function layer 132 may be formed on the isolation structure 120 by any suitable deposition process, such as CVD. The bottom work-function layer with low work-function value can raise saturation current.

Still referring to FIG. 3 and FIG. 9, in the operation 18 of the method 10, a middle work-function layer 134 is formed on the bottom work-function layer 132 and in the first and the second trenches T1 and T2. In some embodiments, a top surface of the bottom work-function layer 132 in the third and the fourth trenches T3 and T4 and a bottom 144a of the middle work-function layer 134 in the first and the second trenches T1 and T2 are at same horizontal level. Therefore, the middle work-function layer 134 formed in the third and fourth trenches T3 and T4 has a thickness that is same as a thickness of the middle work-function layer 134 formed in the first and the second trenches T1 and T2. In some embodiments, the middle work-function layer 134 has a work-function value that is higher than the work-function value of the bottom work-function layer 132. In some examples, the middle work-function layer 134 may be conductive materials such as tungsten (W). The formation of the middle work-function layer 134 may be same as or similar to the formation of the bottom work-function layer 132. The middle work-function layer 134 with high work-function value can keep the higher sub-threshold voltage to reduce channel leak.

Still referring to FIG. 3 and FIG. 9, in the operation 20 of the method 10, a top work-function layer 136 is formed on the middle work-function layer 134. In some embodiments, the top work-function layer 136 has a work-function value that is lower than the work-function value of the middle work-function layer 134. In some embodiments, the top work-function layer 136 may include low work-function material that is same as or similar to the bottom work-function layer 132. For example, the top work-function layer 136 includes polysilicon. The formation of the top work-function layer 136 may be same as or similar to the formation of the bottom work-function layer 132 and the middle work-function layer 134. The top work-function layer 136 with low work-function can reduce the gate-induced drain leakage (GIDL) current of the semiconductor structure 100.

Still referring to FIG. 3 and FIG. 9, in the operation 22 of the method 10, a capping layer 150 is formed on the top work-function layer 136 that fills a remaining region of the first, the second, the third and the fourth trenches T1, T2, T3, and T4. In some embodiments, the capping layer 150 includes silicon nitride or other suitable dielectric materials. In some embodiments, the capping layer 150 is formed by CVD, ALD, or other suitable process. In some embodiments, the method of forming the capping layer 150 may include forming a dielectric material (not shown) to cover the word line structures (the word line structure WL1, the second word line structure WL2, the third word line structure WL3, and the fourth word line structure WL4), the dielectric layer 140, and the isolation structure 120. A planarization operation, such as a chemical mechanical polishing (CMP) method and/or an etch-back method is then performed, such that a portion of the dielectric material is removed to form the capping layer 150. In other words, a top surface of the capping layer 150, a top surface of the dielectric layer 140, and a top surface of the isolation structure 120 are at same horizontal level.

In some embodiments, the method 10 further includes forming a doped region 116 in the active region 112 between the first and the second trenches T1 and T2. In some embodiments, a bit line contact 210 (shown in FIG. 2) electrically connected to the doped region 116 is further formed thereon. In some embodiments, capacitors 220 (shown in FIG. 2) are formed on a top surface of the active region 112 between the isolation structure 120 and the first and the second trenches T1 and T2 (i.e., the doped regions 114) respectively. As a result, the semiconductor structure 100 shown in FIG. 2 can be obtained.

As described above, according to the embodiments of the present disclosure, a semiconductor structure and a method of manufacturing the same are provided. The semiconductor structure has a first, a second, a third, and a fourth word line structures. Each of the third and the fourth word line structure has a bottom work-function layer, a middle work-function layer, and a top work-function layer, wherein the middle work-function layer has a work-function that is higher than a work-function of the top work-function layer and a work-function of the bottom work-function layer. The bottom work-function layer with a low work-function value can raise saturation current. The middle work-function layer with a higher work-function value can keep the higher sub-threshold voltage to reduce channel leak. The top work-function layer with a low work-function value can reduce GIDL current. Therefore, higher driving current and lower threshold voltage sensitivity can be achieved and short channel effect can be avoided. As a result, the performance of the semiconductor structure can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
   a substrate, wherein the substrate has an active region surrounded by an isolation structure;
   a first word line structure and a second word line structure disposed in the active region and separated from each other; and
   a third word line structure and a fourth word line structure disposed in the isolation structure, wherein each of the third word line structure and the fourth word line structure comprises:
   a bottom work-function layer;
   a middle work-function layer on the bottom work-function layer; and
   a top work-function layer on the work-function middle layer, wherein the middle work-function layer has a work-function that is higher than a work-function of the top work-function layer and a work-function of the bottom work-function layer.

2. The semiconductor structure of claim 1, further comprising first source/drain regions and a second source/drain region, wherein the second source/drain region is disposed between the first and the second word line structures, and the first and the second source/drain regions are disposed on opposite sides of each of the first word line structure and the second word line structure.

3. The semiconductor structure of claim 2, further comprising capacitors electrically connected to the first source/drain regions, and a bit line contact electrically connected to the second source/drain region.

4. The semiconductor structure of claim 1, wherein each of the first word line structure and the second word line structure comprises a lower portion and an upper portion, wherein the lower portion has a work-function that is higher than a work-function of the upper portion.

5. The semiconductor structure of claim 4, wherein the lower portion of the first and the second word line structures are same as the middle work-function layer of the third and the fourth word line structures, and the upper portion of the first and the second word line structures are same as the top work-function layer of the third and the fourth word line structures.

6. The semiconductor structure of claim 1, further comprising a dielectric layer between the first word line structure and an inner surface of the active region, and between the second word line structure and another inner surface of the active region.

7. The semiconductor structure of claim 1, wherein a bottom of the third word line structure and the fourth word line structure is disposed below a bottom of the first word line structure and the second word line structure.

8. The semiconductor structure of claim 1, wherein a bottom surface of the middle work-function layer and a bottom surface of each of the first and the second word line structures are at same horizontal level.

9. The semiconductor structure of claim 1, wherein a top surface of the top work-function layer and a top surface of each of the first and the second word line structures are at same horizontal level.

10. The semiconductor structure of claim 1, further comprising a capping layer disposed on the first, the second, the third, and the fourth word line structures.

11. The semiconductor structure of claim 10, wherein the capping layer has a top surface that is level with a top surface of the isolation structure.

* * * * *